United States Patent
Simon et al.

(10) Patent No.: US 9,692,387 B2
(45) Date of Patent: Jun. 27, 2017

(54) BALUN TRANSFORMER

(71) Applicant: FREESCALE SEMICONDUCTOR, INC., Austin, TX (US)

(72) Inventors: Jeremie Jean Simon, Saubens (FR); Laurent Gauthier, Pins Justaret (FR); Maria Del Carmen Medina Urturi, Toulouse (FR); Lionel Mongin, Tempe, AZ (US)

(73) Assignee: NXP USA, INC., Austin, TX (US)

( * ) Notice: Subject to any disclaimer, the term of this patent is extended or adjusted under 35 U.S.C. 154(b) by 17 days.

(21) Appl. No.: 14/979,842

(22) Filed: Dec. 28, 2015

(65) Prior Publication Data

US 2017/0026023 A1  Jan. 26, 2017

(51) Int. Cl.
| | |
|---|---|
| *H03H 7/42* | (2006.01) |
| *H01P 5/10* | (2006.01) |
| *H03F 1/56* | (2006.01) |
| *H03F 3/26* | (2006.01) |
| *H03F 3/195* | (2006.01) |

(52) U.S. Cl.
CPC ............ *H03H 7/42* (2013.01); *H01P 5/10* (2013.01); *H03F 1/56* (2013.01); *H03F 3/195* (2013.01); *H03F 3/26* (2013.01); *H03F 2200/06* (2013.01); *H03F 2200/09* (2013.01); *H03F 2200/222* (2013.01); *H03F 2200/387* (2013.01); *H03F 2200/451* (2013.01)

(58) Field of Classification Search
CPC .................................. H01P 5/10; H03H 7/42
USPC ............................................................ 333/26
See application file for complete search history.

(56) References Cited

U.S. PATENT DOCUMENTS

| | | | | |
|---|---|---|---|---|
| 4,482,873 | A | * | 11/1984 | Nyhus ................... H01P 5/187 333/116 |
| 4,755,775 | A | * | 7/1988 | Marczewski ............ H01P 5/10 333/26 |
| 5,061,910 | A | * | 10/1991 | Bouny ................. H01F 27/2804 330/275 |
| 5,594,393 | A | * | 1/1997 | Bischof ................... H01P 3/026 333/128 |
| 6,294,965 | B1 | | 9/2001 | Merrill et al. |
| 6,377,134 | B1 | * | 4/2002 | Takenaka ................ H01P 1/184 333/161 |
| 7,471,167 | B2 | * | 12/2008 | Kim ......................... H01P 5/10 333/238 |
| 7,656,247 | B2 | | 2/2010 | Kaehs |

(Continued)

*Primary Examiner* — Dean Takaoka

(57) ABSTRACT

A balun includes a dielectric layer having first and second sides, an electrically conductive plate on the second side of the dielectric layer, a first electrically conductive line on the first side and comprising a first end electrically connected to a first terminal and a second end, a second electrically conductive line on the second side and comprising a third end electrically coupled to a second terminal and a fourth end connected to an unbalanced terminal and a micro strip line comprising a fifth end electrically connected to the third end and a sixth end. The first electrically conductive line overlaps the second electrically conductive line. The second and the sixth ends are electrically coupled to the electrically conductive plate. The electrically conductive plate is hollowed in at least a region corresponding to an overlap area of the first electrically conductive line and second electrically conductive line.

20 Claims, 4 Drawing Sheets

(56) References Cited

U.S. PATENT DOCUMENTS

| | | | |
|---|---|---|---|
| 8,154,360 B2* | 4/2012 | Uemichi | H01L 23/49822 333/238 |
| 8,471,645 B2* | 6/2013 | Ujita | H01P 5/10 333/238 |
| 2014/0022027 A1 | 1/2014 | Cammarata | |

* cited by examiner

BALUN TRANSFORMER

CROSS REFERENCE TO RELATED APPLICATION(S)

The present application claims priority to International Patent Application No. PCT/IB2015/001535, entitled "A BALUN TRANSFORMER," filed on Jul. 24, 2015, the entirety of which is herein incorporated by reference.

FIELD OF THE INVENTION

This invention relates to a balun, a matching circuit and a power amplifier incorporating the balun.

BACKGROUND OF THE INVENTION

A balun device is a transformer connected between a balanced terminal and an unbalanced terminal. The balanced terminal is connected to a balanced impedance and the unbalanced terminal to an unbalanced impedance. For example, the balanced terminal can be connected to either a source or load impedance of a matching circuit or an amplifier device. Similarly the unbalanced terminal can be connected to either a load or source impedance of the matching circuit or amplifier device.

Electronic devices generally include input or output balanced terminals such that differential signals can be used to for example improve common mode rejection, cancel out signal offset, noise, and the like. It is desirable to combine differential signals in order to generate a single-ended signal to be processed. A balun device is suitable to convert differential output signals into an output signal of the single-ended type.

Baluns can be manufactured on printed circuit boards (PCBs). Typical baluns include a first portion that is manufactured by means of a metal track printed on one of the planar surfaces of the PCB and a second portion that is manufactured with a coaxial cable which is connected to the first portion on the same planar surface. The terminal ends of the first portion are usually connected to corresponding terminal ends of the coaxial cable by for example welding. However, these known baluns cannot be manufactured with sufficient reproducibility, need to be manually welded, and have a large footprint.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements, which correspond to elements already described, may have the same reference numerals.

DETAILED DESCRIPTION OF THE PREFERRED EMBODIMENTS

Herewith below an inventive balun will be described. The inventive balun includes a micro strip line and two suspended coupled lines on a stack of at least an electrically conductive plate and a dielectric layer. The suspended coupled lines are formed out of two electrically conductive lines. The dielectric layer is sandwiched between the two electrically conductive lines. In the electrically conductive plate, a hollowed region is derived in a portion of the electrically conductive plate corresponding to an overlap area of the suspended coupled lines. The micro strip line can compensate for asymmetry and impedance transformation of the suspended coupled lines. The proposed balun can be fully integrated in a printed circuit board. The micro strip line and the suspended coupled lines can be printed on either side of the dielectric layer such that the size of the proposed balun is more compact than the size of conventional coaxial cable-based baluns. Further, full integration of the inventive balun on a printed circuit board enhances reproducibility of the balun and makes it more suitable for high frequency applications. The inventive balun can for example be used in the context of high frequency applications, for example in radio frequency (RF) circuits, RF power amplifiers or the like for transforming signals between a balanced impedance and an unbalanced impedance.

Radio frequency (RF) power amplifiers can require relatively high power to be delivered to an output load. Where output power requirements of the radio frequency (RF) power amplifier exceed the output power capability of a single transistor, a plurality of transistors may be coupled to share the power demand. A common way of coupling two transistors to deliver high power to the output load is the technique known in the art as "push-pull". In this technique driving of the load is shared between a transistor driving current through the load in one direction and a second transistor driving current through the load in the opposite direction. This arrangement allows to match impedances of larger values than for example the low impedances of a single transistor or even the lower impedances of a plurality of transistors arranged in parallel. Matching impedances of larger values facilitates design of the matching circuit. Since the push-pull outputs a differential signal and typically the RF power amplifier can deliver power to a single ended output load, a transformer can be used to couple the differential signal to the load.

Such transformer is in the art known as a balun.

Figure 1:
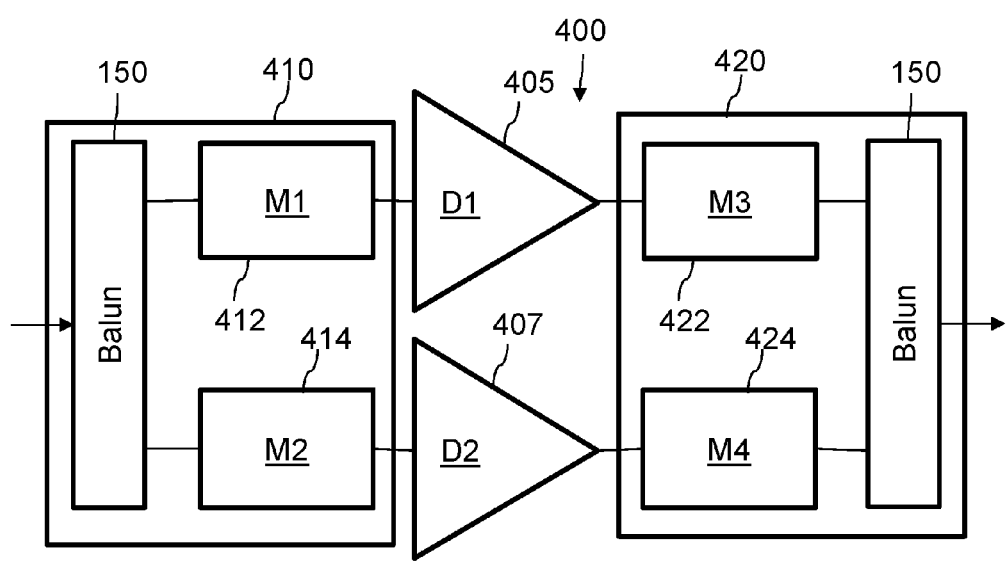
FIG. 1 schematically shows a power amplifier.

FIG. 1 schematically shows an example of a power amplifier 400 incorporating an inventive balun 150 later described with reference to FIG. 2. The power amplifier 400 can operate in push-pull. The power amplifier 400 includes two power amplifier devices 405 (D1) and 407 (D2) configured to operate in push pull, an input matching circuits 410 to match a unbalanced input impedance to a balanced input impedance of the two power amplifier devices 405 and 407, and an output matching circuit 420 configured to match a balanced output impedance of the two power amplifier devices 405 and 407 to an unbalanced output impedance of the power amplifier 400.

The input matching circuit 410 includes two input circuit sections. A first input circuit section includes a balun 150 that provides signal transformation between the unbalanced input of the power amplifier 400 and an intermediate balanced input. A second circuit section includes circuits 412 and 414 that provide impedance transformation of the signal at the intermediate balanced input to the signal at respective balanced inputs of the two power amplifier devices 405 and 407.

Similarly, the output matching circuit 420 includes two output circuit sections. A first output circuit section includes circuits 422 and 424 that provide impedance transformation of the signal at respective balanced outputs of the two power amplifier devices 405 and 407 to the signal at respective intermediate balanced outputs. A second output circuit section includes the balun 150 that provides signal transformation between the respective intermediate balanced outputs and the signal at the unbalanced output of the power amplifier 400.

Figure 2:
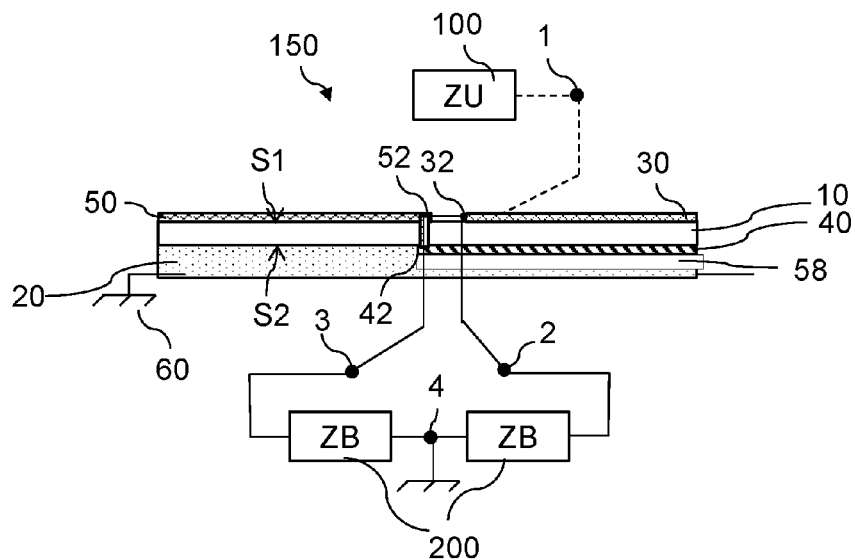
FIG. 2 schematically shows a cross section of a first example of a balun taken along the line II-II in FIG. 3, FIG. 3 schematically shows a perspective view of the balun shown in FIG. 2, FIG. 4 schematically shows a cross section of a second example of a balun taken along the line IV-IV in FIG. 5, FIG. 5 schematically shows a perspective view of the balun shown in FIG. 4, FIG. 6 schematically shows a diagram of the insertion losses between the signals at the balanced terminals and the signal at the unbalanced terminal of the balun shown in FIG. 1, FIG. 7 schematically shows a diagram of the phase shift between the signals at the balanced terminals and the signal at the unbalanced terminal of the balun shown in FIG. 1.
Figure 3:
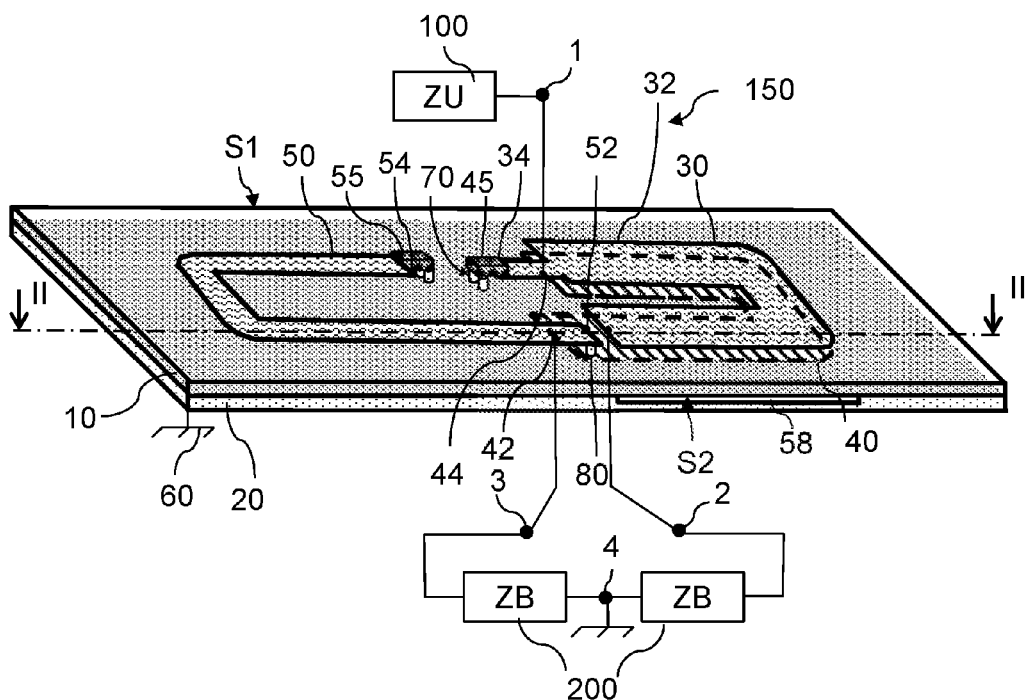

FIG. 2 schematically shows a cross section of a balun 150 according to embodiments of the present invention taken along the line II-II in FIG. 3. The balun 150 is, as explained above, suitable for transforming signals between an unbalanced impedance 100 (ZU) and a balanced impedance 200 (ZB). The balance impedance 200 can be a differential impedance with reference to a common reference terminal 4. The balun 150 includes an unbalanced terminal 1 to which the unbalanced impedance 100 is connected, a first terminal 2 and a second terminal 3 to which the balanced impedance 200 is connected, a stack of at least an electrically conductive plate 20 and a dielectric layer 10. The dielectric layer 10 has a first side S1 and a second side S2 opposite to the first side S1. The electrically conductive plate 20 is arranged on the dielectric layer 10 at its second side S2. The electrically conductive plate 20 can be electrically connected to a reference potential, for example the ground 60. The balun 150 further includes a first electrically conductive line 30 arranged on the dielectric layer 10 at the first side S1 of the dielectric layer 10 and a second electrically conductive line 40 arranged on the dielectric layer 10 at the second side S2 of the dielectric layer 10 such that the first electrically conductive line 30 substantially overlaps the second electrically conductive line 40. The second side S2 of the dielectric layer 10 is, in the example shown in FIG. 2 and FIG. 3, facing the electrically conductive plate 20. The first electrically conductive line 30 is arranged on a first planar surface of the dielectric layer 10 and overlaps the second electrically conductive line 40 which is arranged on a second planar surface of the dielectric layer 10 opposite to the first planar surface.

The first electrically conductive line 30 has a first end 32 and a second end (not shown in FIG. 2). The first end 32 is electrically coupled to the first terminal 2, while the second end is electrically coupled to the electrically conductive plate 20, which is, in this example, connected to the ground 60. The second end can be electrically coupled to the electrically conductive plate 20 via for example a capacitor (not shown in FIG. 2). The second end of the first electrically conductive line 30 can be electrically coupled, as it will be shown later in FIG. 3, to the ground 60 via for example a surface mounted device (SMD) capacitor mounted on the dielectric layer 10 at the first side S1. One capacitor terminal can be electrically connected to the second end and the other capacitor terminal can be electrically connected to the electrically conductive plate 20 via one or more electrically conductive via holes through the dielectric layer 10.

The second electrically conductive line 40 has a third end 42 and a fourth end (not shown in FIG. 2). The third end 42 is electrically coupled to the second terminal 3, while the fourth end is electrically connected to the unbalanced terminal 1 (as indicated by the dashed line in FIG. 2).

The balun 150 further includes a micro strip line 50 having a fifth end 52 electrically connected to the third end 42 and a sixth end (not shown in FIG. 2) electrically coupled to the electrically conductive plate 20, which is in this example connected to the ground 60. The sixth end of the micro strip line 50 can be electrically coupled to the ground 60 via for example a capacitor (not shown in FIG. 2) to block any direct current (DC) from the micro strip line 50 to the ground 60. As shown later FIG. 3, the sixth end of the micro strip line 50 can be electrically coupled to the ground 60 via for example a surface mounted device (SMD) capacitor mounted on the first side S1 of the dielectric layer 10. One capacitor terminal can be electrically connected to the sixth end and the other capacitor terminal can be electrically connected to the electrically conductive plate 20 via one or more electrically conductive via holes through the dielectric layer 10.

As shown in FIG. 2, the micro strip line 50 can be separated from the electrically conductive plate 20 by the dielectric layer 10. The electrically conductive plate 20 can be in direct contact with the dielectric layer 20 at the second side S2 of the dielectric layer 10 such to provide a ground plane for the micro strip line 50.

Alternatively, in an embodiment not shown in the Figures, an additional metal layer can be patterned at the second side S2 of the dielectric layer 10 and be in electrical contact with the electrically conductive plate 20 such to provide the ground plane for the micro strip line 50. Such metal layer can extend on the dielectric layer 10 at the second side S2 of the dielectric layer 10 such to overlap with continuity an area occupied by the micro strip line 50.

The electrically conductive plate 20 is hollowed in at least a region 58 corresponding to an overlap area of the second electrically conductive line 40 with the first electrically conductive line 30. The region 58 under the second electrically conductive line 40 can be filled with any suitable dielectric material. For example, the region 58 can be filled with air or with any other suitable dielectric material suitable for high frequency (radio frequency) applications.

The hollowed region 58 of the electrically conductive plate 20 can have any suitable shape. For example the hollowed region 58 can have a cylindrical or cuboidal shape.

FIG. 3 shows a perspective view of the balun 150 shown in FIG. 2. The first electrically conductive line 30 is arranged on the dielectric layer 10 at the first side S1 of the dielectric layer 10. The second electrically conductive line 40 is arranged on the dielectric layer 10 at the second side S2 of the dielectric layer 10 opposite to the first side S1.

The first electrically conductive line 30, the second electrically conductive line 40 and the micro strip line 50 can have any shape suitable for the specific implementation. For example, as shown in FIG. 3, the first electrically conductive line 30, the second electrically conductive line 40 and the micro strip line 50 have a U shape. However, the first electrically conductive line 30, the second electrically conductive line 40 and the micro strip line 50, can for example be implemented with curved shape, straight line shape, serpentine shape or S shape, or any other suitable shape.

A first end 32 of the first electrically conductive line 30 is electrically coupled to the first terminal 2 and via the first terminal 2 to the balanced impedance 200.

A second end 34 of the second electrically conductive line 30 is electrically coupled to the electrically conductive plate 20. The second electrically conductive line 30 is electrically coupled to the ground 60 via, in the embodiment of FIG. 3, a capacitor 45.

As explained, a capacitor 45 of the type described above can be connected to the second end 34 of the first electrically conductive line 30. A first electrode of the capacitor 45 can be soldered to the second end 34 of the first electrically conductive line 30. A second electrode of the capacitor 45 can be electrically connected via one or more electrically conductive via holes 70 arranged through the dielectric layer 10 to the electrically conductive plate 20.

A third end 42 of the second electrically conductive line 40 is electrically connected to the second terminal 3 and via the second terminal 3 to the balanced impedance 200.

A fourth end 44 of the second electrically conductive line 40 is electrically coupled to the unbalanced terminal 1 and via the unbalanced terminal 1 to the unbalanced impedance 100.

A fifth end 52 of the micro strip line 50 is electrically connected to the first terminal 2 and the third end 42 of the second electrically conductive line 40 via for example one or more electrically conductive vias 80 arranged through the dielectric layer 10.

A sixth end 54 of the micro strip line 50 is electrically coupled to the electrically conductive plate 20 and via the electrically conductive plate 20 to the ground 60. A surface mounted capacitor 55 can electrically couple the sixth end 54 to the electrically conductive plate 20.

The capacitor 55 can have a first electrode soldered to the sixth end 54 of the micro strip line 50 and a second electrode electrically connected to the electrically conductive plate 20 via one or more electrically conductive vias 90 arranged through the dielectric layer 10.

The capacitor 45 and the capacitor 55 can be suitably used to provide radio frequency (RF) ground to the second end 34 of the first electrically conductive line 30 and to the sixth end 54 of the micro strip line 50, respectively, while blocking any direct current (DC) to the ground. The capacitor 45 and the capacitor 55 can also provide suitable impedance transformation to the signals in the balun 150.

Balun 150 is obtainable with electrically conductive lines printable on a dielectric layer 10 used as substrate which can be easily manufactured. The first electrically conductive line 30 and the second electrically conductive line 40 are two suspended coupled lines. The micro strip line 50 is used to compensate for asymmetries in the two suspended coupled lines structure.

The balun 150 can be implemented on a printed circuit board of suitable type and thus can be designed with enhanced reproducibility and precision than known solutions which make use of coaxial cables and need to be manually mounted. Furthermore, the balun 150 is considerably smaller than prior art baluns. For the same frequency range of utilization, the balun 150 can be substantially smaller than prior art baluns, for example more than 30% smaller.

Advantageously, in the embodiment shown in FIG. 2 and FIG. 3, the electrically conductive plate 20 is hollowed only in the region 58 corresponding to an area wherein the suspended coupled lines 30 and 40 structure is arranged. Under the micro strip line 50 at the second side S2 of the dielectric layer 10, the electrically conductive plate 20 acts as the ground plane for the micro strip line 50, i.e. the electrically conductive plate 20 under the micro strip line 50 is not hollowed. After providing the electrically conductive plate 20 under the dielectric layer 10, a hole can be drilled or bored onto the electrically conductive plate 20 on the region 58. By drilling only in the region 58, the machining time can be substantially reduced.

Figure 4:
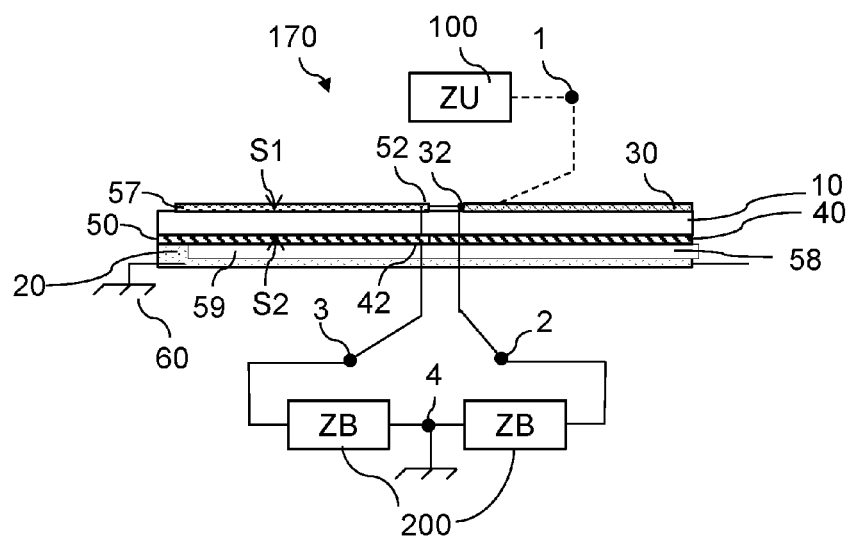
Figure 5:
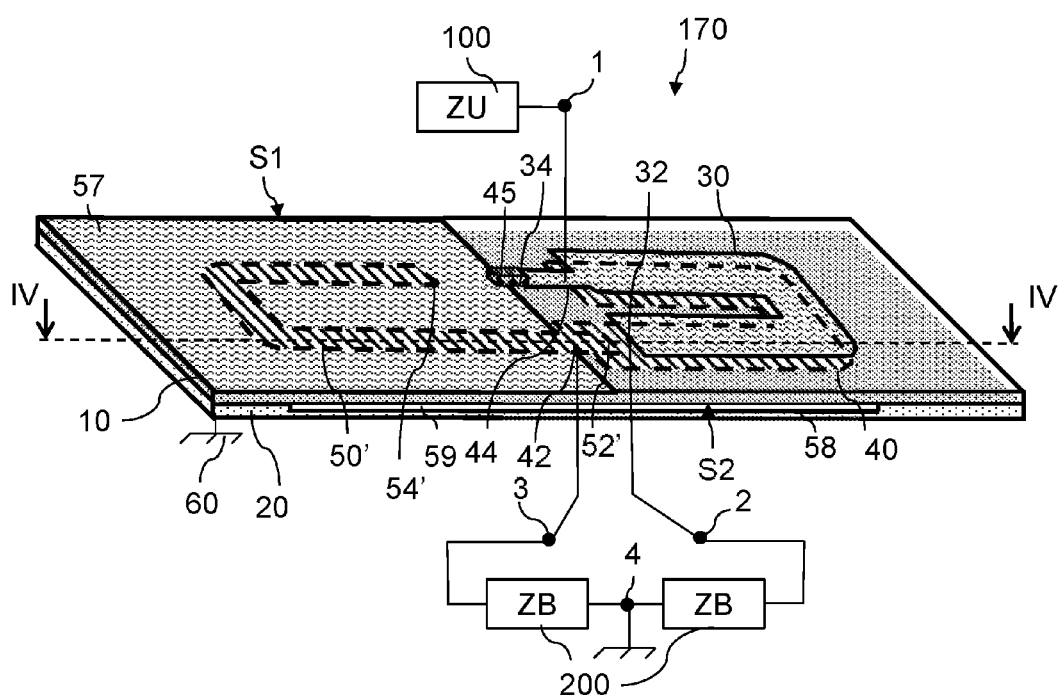

FIG. 4 schematically shows a cross section of another example of a balun 170 according to embodiments of the present invention taken along the line IV-IV in FIG. 5. Parts of FIG. 4 and FIG. 5 having the same reference numbers of respective FIG. 2 and FIG. 3 have the same function and will be not described in detail.

The balun 170 differs from the balun 150 in that the micro strip line 50 is arranged on the dielectric layer 10 at the second side S2, i.e. in this example the bottom side, of the dielectric layer 10. Further the electrically conductive plate 20 is also hollowed in a region 59 corresponding to an area on which the micro strip line 50' is arranged. Since the micro strip line 50 is arranged on the dielectric layer 10 at the second side S2, the ground plane of the micro strip line 50 can be placed at the first side of the dielectric layer 10 such that a better accessible ground, especially at relatively high frequencies, can be provided at the first side S1 of the dielectric layer 10.

In the example of FIG. 4 and FIG. 5, a ground plane 57 of the micro strip line 50' is provided on the first side S1, i.e. in this example the top side, of the dielectric layer 10.

A fifth end 52' of the micro strip line 50' can be electrically connected to the third end 42 directly on the second side S2 of the dielectric layer 10, i.e. without via holes arranged through the dielectric layer 10.

A sixth end 54' of the micro strip line 50' can be electrically connected to the electrically conductive plate 20, i.e. to the ground 60 directly on the second side S2 of the dielectric layer 10.

By having the ground plane 57 on the dielectric layer 10 at the first side S1 of the dielectric layer 10 and the micro strip line 50' on the same plane of the second electrically conductive line 40, electrical connections between the second end 34 and ground via the capacitor 45 and between the micro strip line 50' and the second electrically conductive line 40 can be easily realized.

Both baluns 150 and 170, can include a first electrically conductive layer (not shown in the figures) at the first side S1 of the dielectric layer 10. The first electrically conductive layer can include a first layer portion and a second layer portion electrically isolated from the first layer portion. The first electrically conductive line 30 can be formed with the first layer portion. The second layer portion can have one or more second terminals connected to the electrically conductive plate 20.

Alternatively or in addition to the first electrically conductive layer, both baluns 150 and 170 can include a second additional electrically conductive layer arranged on the dielectric layer 10 at its second side S2. The second electrically conductive layer can include a third layer portion and a fourth layer portion electrically isolated from the third layer portion. The second electrically conductive line 40 can be formed with the third layer portion. The fourth layer portion can have one or more second terminals connected to the electrically conductive plate 20.

These second and fourth layer portions, when present together, can be connected together via one or more via holes arranged through the dielectric layer 10 and connected to the electrically conductive plate 20, i.e. to the ground 60. These second and fourth layer portions, when present together, can surround the respective first and second electrically conductive lines 30 and 40 to provide an effective ground for the first and second electrically conductive lines 30 and 40.

Similarly, the micro strip line 50 or 50' can be separated at the associated first side S1, for the balun 150, or second side S2, for the balun 170, by an electrically conductive layer portion surrounding the micro strip line 50 or 50' and connected to the ground 60.

By providing an extended ground plane on each side S1 and S2 of the dielectric layer 10, the ground, especially at relatively high frequencies, for example at RF's or microwave frequencies, can be substantially improved.

In an embodiment the unbalanced terminal 1 and the first terminal 2 have a first phase difference, the unbalanced terminal 1 and the second terminal 3 have a second phase difference. The first electrically conductive line 30, the second electrically conductive line 40 and the micro strip line 50 or 50' are arranged such that the difference between the first phase difference and the second phase difference is less than 180 degrees.

For example, said phase difference can be substantially equal to 160 degrees. In conventional baluns the phase shift between the balanced and unbalanced terminal is typically 180 degrees to prevent phase shift in the balanced to unbalanced impedance transformation.

The decreased phase shift can lead to yet a smaller balun while at the same time ensuring some degree of impedance transformation between the balanced terminals 2 and 3 and the unbalanced terminal 1. This can for example allow to reduce sizes of the input and/or output matching circuits 410, 420 shown in FIG. 1.

The impedance transformation ratio between the balanced impedance 200 and the unbalanced impedance 100 provided by the balun 150 can be any ratio suitable for the specific implementation.

For example, in an embodiment, the first electrically conductive line 30, the second electrically conductive line 40 and the micro strip line 50 or 50' are arranged such that the balanced impedance 200 is lower than the unbalanced impedance 100. In another embodiment the balanced impedance 200 can be less than half the unbalanced impedance 100.

For example, the unbalanced impedance can be 50 Ohms and the balanced impedance can be less than 25 Ohm, for example 20 Ohms or less.

By increasing the ratio between the balanced to unbalanced impedance transformation, the balun 150 can be advantageously used as impedance matching circuit. If a specific application requires yet a greater balanced to unbalanced impedance transformation ratio, as for example in the input or output matching circuits 410 and 420 of the RF power amplifier 400 shown in FIG. 1 which can require a balanced to unbalanced transformation ratio of 20 or more, the balun 150 can be used to provide part of this greater transformation ratio. For example, with reference to the RF power amplifier 400 of FIG. 1, the circuit sections 412, 414, 422 and 424 can be made smaller.

In an embodiment, the first electrically conductive line 30 and the second electrically conductive line 40 are arranged to have a first electrical length and the micro strip line 50 or 50' is arranged to have a second electrical length substantially larger than the first electrical length. Electrical length is the equivalent physical length of the line at a predetermined operating frequency. It is well known, that signals propagating through a conductor at a predetermined frequency change their phase and thus their impedance. Phase change depends on the length of the conductor and dielectric material surrounding the conductor through which propagation occurs and frequency of propagation. The electrical length of the conductor refers to the length of the conductor in terms of phase shift introduced by transmission over that conductor.

In an embodiment, the balun 150 or 170 is arranged to transform signals between the unbalanced impedance 100 and the balanced impedance 200 for a predetermined range of operating frequencies. The first electrical length can be substantially equal to one fifth of a wavelength, taken as substantially corresponding to a middle frequency of the predetermined range of operating frequencies, and the second electrical length is substantially equivalent to one tenth of said wavelength.

Figure 6:
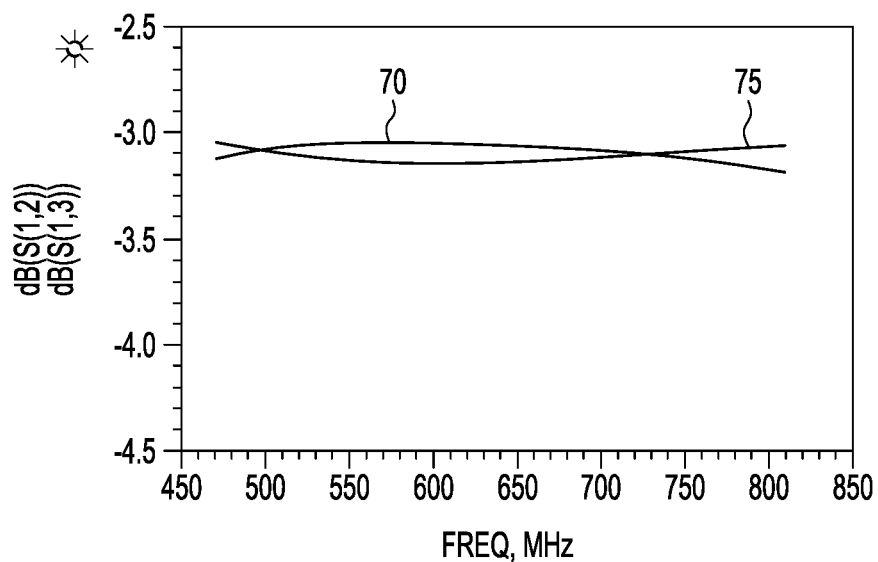

FIG. 6 schematically shows a diagram of the calculated insertion losses versus frequency of the balun 150 shown in FIG. 1. Insertion losses 70 relate to the signal attenuation between the signal at unbalanced terminal 1 and the signal at first balanced terminal 2. Insertion losses 75 relate to the signal attenuation between the signal at the unbalanced terminal 1 and the signal at the second balanced terminal 3. Both insertion losses 70 and 75 are relatively flat within the frequency range 450-850 MHz. Both insertion losses 70 and 75 are in a range of 2.7-3.5 dB in the frequency range 450-850 Mhz (i.e. the balun 150 has a relatively flat and wideband response).

Figure 7:
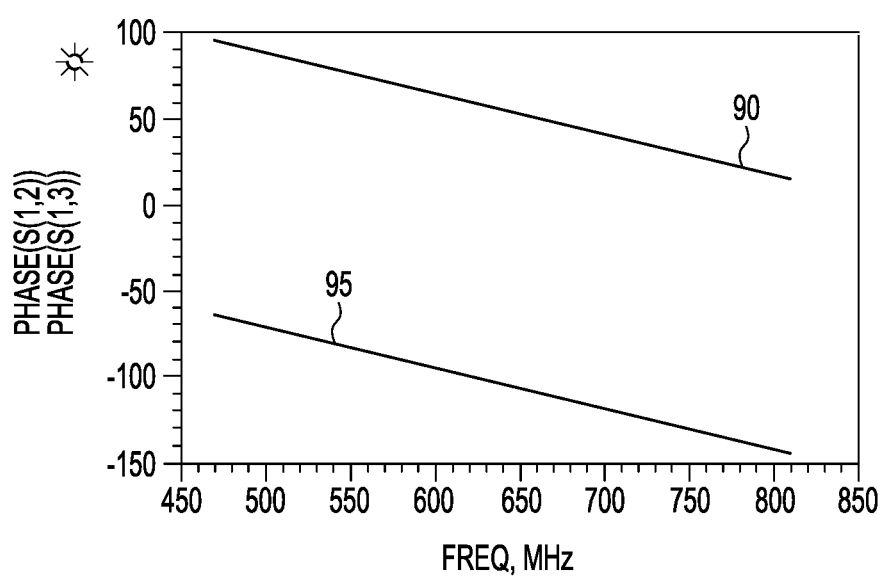

FIG. 7 schematically shows a diagram of the calculated phase shift between the signal at the balanced terminals 2 and 3, and the signal at unbalanced terminal 1 versus frequency of the balun 150 shown in FIG. 1. As mentioned above, the phase difference of the relative phase shifts 90 and 95 between the balanced terminals 2 and 3 and the unbalanced terminal 1 of the balun 150 or 170 is substantially 160 degrees. This means that a phase offset of substantially 20 degrees can be introduced in the balun or in the matching circuit.

The diagrams of FIG. 6 and FIG. 7 are calculated in a predetermined frequency range 450-850 Mhz. However, the balun 150 or 170 can be designed for other frequency ranges suitable for other applications than power amplifiers by for example changing the micro strip line and suspended coupled lines lengths. For example, the predetermined frequency range can be in the operating frequency range of a mixer, a modulator, a voltage controlled oscillator (VCO).

In the foregoing specification, the invention has been described with reference to specific examples of embodiments of the invention. It will, however, be evident that various modifications and changes may be made therein without departing from the scope of the invention as set forth in the appended claims.

The connections may be any type of connection suitable to transfer signals from or to the respective nodes, units or devices, for example via intermediate devices. Accordingly, unless implied or stated otherwise the connections may for example be direct connections or indirect connections.

Because the apparatus implementing the embodiments of the present invention is, for the most part, composed of electronic components and circuits known to those skilled in the art, circuit details have not been explained in any greater extent than that considered necessary, for the understanding and appreciation of the underlying concepts of the embodiments of the present invention and in order not to obfuscate or distract from the teachings of the embodiments of the present invention.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably electrically coupled," to each other to achieve the desired functionality.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Furthermore, the devices may be physically distributed over a number of apparatuses, while functionally operating as a single device. Also, devices functionally forming separate devices may be integrated in a single physical device. Also, the units and circuits may be suitably combined in one or more semiconductor devices. However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or an limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

What is claimed is:

1. A balun for transforming signals between an unbalanced impedance and a balanced impedance, comprising:
    a stack of at least an electrically conductive plate, and a dielectric layer having a first side and a second side opposite to the first side;
    a first electrically conductive line comprising a first end and a second end, arranged on the dielectric layer at the first side of the dielectric layer;
    a second electrically conductive line comprising a third end and a fourth end, arranged on the dielectric layer at the second side of the dielectric layer such that the first electrically conductive line substantially overlaps the second electrically conductive line; and
    a micro strip line comprising a fifth end electrically coupled to the third end and a sixth end electrically coupled to the electrically conductive plate; wherein
    the electrically conductive plate is arranged on the dielectric layer at the second side,
    the first end is electrically coupled to the balanced impedance, the second end is electrically coupled to the electrically conductive plate, the third end is electrically coupled to the balanced impedance, the fourth end to the unbalanced terminal, and
    the electrically conductive plate is hollowed in at least a region corresponding to a portion of an overlap area of the first electrically conductive line and second electrically conductive line.

2. A balun according to claim 1 comprising an unbalanced terminal coupled to the unbalanced impedance and a first terminal and a second terminal coupled to the balanced impedance, wherein the unbalanced terminal and the first terminal have a first phase difference, the unbalanced terminal and the second terminal have a second phase difference, and wherein the first electrically conductive line, the second electrically conductive line and the micro strip line are arranged such that a difference between the first phase difference and the second phase difference is less than 180 degrees.

3. A balun according to claim 1 comprising an unbalanced terminal coupled to the unbalanced impedance and a first terminal and a second terminal coupled to the balanced impedance, wherein the unbalanced terminal and the first terminal have a first phase difference, the unbalanced terminal and the second terminal have a second phase difference, and wherein the first electrically conductive line, the second electrically conductive line and the micro strip line are arranged such that a difference between the first phase difference and the second phase difference is substantially equal to 160 degrees.

4. A balun according to claim 1, wherein the first electrically conductive line, the second electrically conductive line and the micro strip line are arranged to transform the unbalanced impedance to a balanced impedance lower than the unbalanced impedance.

5. A balun according to claim 4, wherein the balanced impedance is less than half the unbalanced impedance.

6. A balun according to claim 1, wherein the micro strip line is arranged on the dielectric layer at the first side of the dielectric layer.

7. A balun according to claim 1, wherein the micro strip line is arranged on the dielectric layer at the second side and the electrically conductive plate is hollowed in a region corresponding to an area on which the micro strip line is arranged.

8. A balun according to claim 1 comprising one or more of:
    a first electrically conductive layer arranged on the dielectric layer at the first side comprising a first layer portion and a second layer portion electrically isolated from the first layer portion, wherein
        the first electrically conductive line is formed with the first layer portion, and the second layer portion has one or more second terminals coupled to the electrically conductive plate; and
    a second electrically conductive layer arranged on the dielectric layer at the second side comprising a third layer portion and a fourth layer portion electrically isolated from the third layer portion, wherein
        the second electrically conductive line is formed with the third layer portion, and the fourth layer portion has one or more second terminals coupled to the electrically conductive plate.

9. A balun according to claim 1, wherein the electrically conductive plate is electrically coupled to a reference potential.

10. A balun according to claim 1, comprising a first capacitor and a second capacitor, wherein the electrically conductive plate has one or more terminals electrically coupled to a reference potential, and the fourth end and the sixth end are electrically coupled to the electrically conductive plate via the first capacitor and second capacitor.

11. A balun according to claim 1, wherein the hollowed region of the electrically conductive plate is filled with a dielectric material.

12. A balun according to claim 1, wherein the first electrically conductive line, the second electrically conductive line and the micro strip line have a shape of a group comprising: curved shape, straight line shape, U shape, serpentine shape, S shape.

13. A balun according to claim 1, wherein the first electrically conductive line and the second electrically conductive line have a first equivalent physical length at a predetermined operating frequency and the micro strip line has a second equivalent length at the predetermined operating frequency substantially larger than the first equivalent physical length.

14. A balun according to claim 1, wherein
the first electrically conductive line and the second electrically conductive line both have a first equivalent physical length at a predetermined operating frequency,
the micro strip line has a second equivalent physical length at the predetermined operating frequency substantially larger than the first electrical length,
the balun is arranged to transform signals between the unbalanced impedance and the balanced impedance for a predetermined range of operating frequencies,
the first equivalent physical length is substantially equal to one fifth of a wavelength substantially corresponding to a middle frequency of the predetermined range of operating frequencies, and
the second equivalent physical length is substantially equivalent to one tenth of said wavelength.

15. A balun according to claim 1, wherein the first electrically conductive line, the second electrically conductive line and the micro strip line are metal lines printed on the dielectric layer at the respective first side or second side.

16. A balun according to claim 1, wherein the hollowed region of the electrically conductive plate has an opening through the electrically conductive plate on a lateral side of the electrically conductive plate.

17. A balun according to claim 1, wherein the hollowed region of the electrically conductive plate is cylindrical, or cuboidal.

18. A balun according to claim 1, arranged to provide a first signal attenuation between a signal at unbalanced terminal and a signal at first balanced terminal, and a second signal attenuation between a signal at the unbalanced terminal and the signal at the second balanced terminal, wherein the first signal attenuation and the second signal attenuation are within a range of 2.7 dB to 3.3 dB in a frequency range of 450 MHz to 850 MHz.

19. A matching circuit configured to match an unbalanced impedance with a balanced impedance, the matching circuit comprising:
a balun for transforming signals between an unbalanced impedance and a balanced impedance, comprising
a stack of at least an electrically conductive plate and a dielectric layer having a first side and a second side opposite to the first side,
a first electrically conductive line comprising a first end and a second end, arranged on the dielectric layer at the first side of the dielectric layer;
a second electrically conductive line comprising a third end and a fourth end, arranged on the dielectric layer at the second side of the dielectric layer such that the first electrically conductive line substantially overlaps the second electrically conductive line;
a micro strip line comprising a fifth end electrically connected to the third end and a sixth end electrically coupled to the electrically conductive plate; and
a first impedance transforming circuit and a second impedance transforming circuit electrically coupled to a first terminal and a terminal of the balanced impedance for matching the balanced impedance into a matched input or output balanced impedance; wherein
the electrically conductive plate is arranged on the dielectric layer at the second side,
the first end is electrically connected to the first terminal, the second end is electrically coupled to the electrically conductive plate, the third end is electrically coupled to the second terminal, and the fourth end to the unbalanced terminal, and
the electrically conductive plate is hollowed in at least a region corresponding to a portion of an overlap area of the first electrically conductive line and second electrically conductive line.

20. A power amplifier comprising an input matching circuit and an output matching circuit as claimed in claim 19 and two amplifier devices configured to operate in push pull and electrically coupled at respective matched balanced outputs of the input matching circuit and at respective matched balanced inputs of the output matching circuit, wherein the input matching circuit is configured to match an unbalanced input impedance of the power amplifier to a balanced input impedance of the two amplifier devices, and the output matching circuit is configured to match a balanced output impedance of the two amplifier devices to an unbalanced output impedance of the power amplifier.

* * * * *